United States Patent [19]

Holder, Jr. et al.

[11] Patent Number: 4,649,523
[45] Date of Patent: Mar. 10, 1987

[54] SEMICONDUCTOR MEMORY WITH BOOSTED WORD LINE

[75] Inventors: Clinton H. Holder, Jr., Catasauqua; Howard C. Kirsch, Emmaus, both of Pa.; James H. Stefany, Asbury, N.J.

[73] Assignee: AT&T Bell Laboratories, Murray Hill, N.J.

[21] Appl. No.: 699,661

[22] Filed: Feb. 8, 1985

[51] Int. Cl.$^4$ .............................................. G11C 7/00
[52] U.S. Cl. ..................................... 365/203; 365/204
[58] Field of Search ............... 365/189, 203, 204, 222, 365/230

[56] References Cited

U.S. PATENT DOCUMENTS

| | | | |
|---|---|---|---|
| 4,291,393 | 9/1981 | Wilson | 365/203 |
| 4,449,207 | 5/1984 | Kung et al. | 365/230 |
| 4,503,343 | 3/1985 | Ohuchi | 365/203 X |

Primary Examiner—Joseph A. Popek
Attorney, Agent, or Firm—James H. Fox

[57] ABSTRACT

A dynamic random access memory has a row conductor boosted in excess of the power supply level during an initial portion of a memory cycle. The voltage is then clamped at the supply level during the middle portion of the cycle, and optionally boosted again during the refresh portion. This allows improved performance and reliability, especially in memories employing bit lines precharged to one-half the power supply level.

4 Claims, 6 Drawing Figures

SEMICONDUCTOR MEMORY WITH BOOSTED WORD LINE

BACKGROUND OF THE INVENTION

1. Field of the Invention

This invention relates to a semiconductor dynamic random access memory having an array of memory cells comprising an information storage capacitor and an access transistor.

2. Decription of the Prior Art

An integrated circuit dynamic random access memory (DRAM) comprises an array of memory cells arranged in rows and columns. For example, an array of 256 rows and 256 columns provides 65,536 memory cells. A given integrated circuit chip or wafer may comprise a multiplicity of arrays, with each array then usually referred to as a "sub-array". The memory cell itself usually comprises an information storage capacitor that communicates with a column conductor through a field effect transistor, referred to as the access transistor. A high voltage level, referred to as a "1", or a low voltage level, referred to as a "0", can be stored in the capacitor. A typical memory array is illustrated in FIG. 1.

To access a given memory cell in the array, a column decoder selects a column conductor for connection to a data input/output (I/O) line. An adjacent "complement" column conductor is also selected in most designs. The column conductors are frequently referred to as "bit lines", and connect to one side of the access transistors in the column. The electrode of a field effect access transistor connected to the column conductor serves alternately as the "drain" or the "source" of the transistor, depending on the voltage between the column conductor and the storage capacitor. A given memory cell is selected when the row conductor for that memory cell is also selected by the row decoder. Activating a row conductor, also referred to as a "word line", allows the access transistor in the selected row to conduct.

Referring to FIG. 1, an exemplary n-channel access transistor M11 conducts when the row conductor R1 is placed at a high voltage level by the row decoder. Then, access to the storage capacitor 10 from column conductor C1 is possible. However, the threshold voltage drop across M11 reduces the voltage that can be written into the storage capacitor. Thus, if the threshold voltage, Vth, of M11 is 1.5 volts, and the accessed row conductor raises the gate voltage on M11 to 5 volts, then a 5 volt write signal on C1 produces only $5-1.5=3.5$ volts on the capacitor 10. This reduction in the stored magnitude of the data written into the cell has a deleterious effect on the reliability of subsequently reading the data from the cell.

To counter the effect of the threshold voltage drop, prior art memories employ a "boosted word line", wherein the voltage on a selected row is increased above the power supply level. Referring to FIG. 2, the row selection process is initiated when the $\overline{RE}$ signal goes low. In one prior art technique, the word line voltage is boosted above the positive power supply voltage during the entire memory cycle (curve A). A boosted voltage of 7 to 8 volts is typical for memories having a nominal 5 volt positive power supply. However, the boosted voltage places stress on the access transistors connected thereto. This stress increases as transistor geometries, and especially gate insulator thicknesses, decrease. Furthermore, boosting for the entire memory cycle places corresponding demands on the boost generator circuit, which must supply any leakage currents. Also, for a given boost generator design, the variability of the leakage curents from chip to chip reduces the yield of usable chips. Therefore, an alternate prior art technique (curve B) supplies the boosted voltage only during the refresh portion of the memory cycle, which is initiated when RE goes high. At other times during the cycle, the selected word line is allowed to remain at the positive power supply level, Vcc.

This latter technique reduces electrical stress on the access transistors and reduces yield limiting leakage problems, while ensuring that a full high voltage level is refreshed in those cells storing a "1". This full refresh level also extends the time period between required refreshes, a desirable result. (This time period is essentially determined by the length of time that the storage capacitor can maintain a high enough voltage to ensure adequate margins for subsequent readout.) Note also that the refresh period occurs near the end of a memory cycle, before the "recovery" period when the columns are precharged in preparation for the next cycle. Hence, the refresh operation must be accomplished in as short a time as possible, to prevent the overall cycle time from becoming excessively large. The boost during refresh helps to speed the necessary charge transfer during this critical time.

SUMMARY OF THE INVENTION

We have invented a dynamic random access memory employing a transitory boost on a selected word line at the beginning of a memory cycle. The boosted voltage is reduced to the power supply level during at least the middle portion of the memory cycle, and optionally boosted again during the refresh portion.

DETAILED DESCRIPTION

Figure 1:
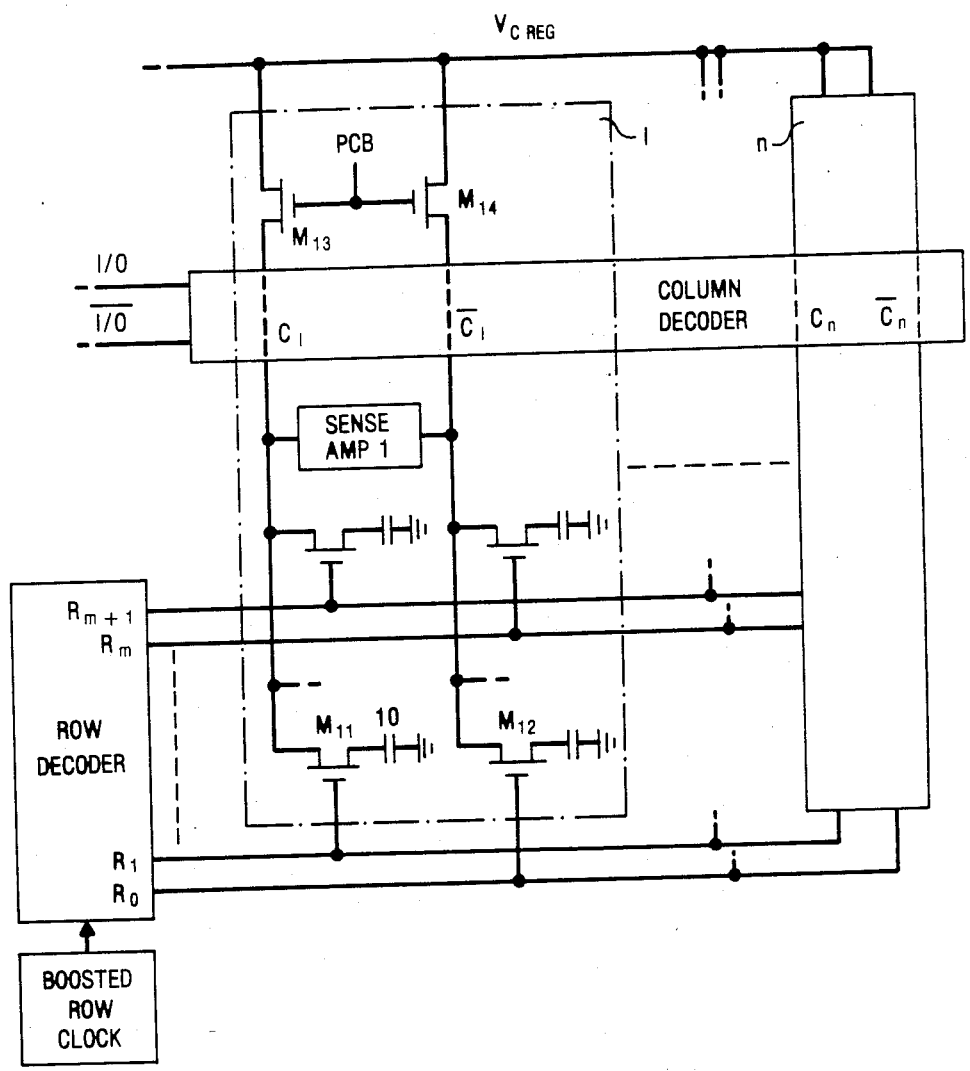
FIG. 1 illustrates a typical prior art memory array.

The following detailed description relates to an improved semiconductor dynamic random access memory. The present invention results from a recognition of inadequacies of prior art techniques. In particular, it is desired to provide a boosted word line to obtain adequate stored signal levels, without continually boosting the word line during the entire memory cycle (curve A, FIG. 1). However, we have determined that boosting only during refresh (curve B) introduces the possibility of inadequate signal margins, especially in memories employing bit lines precharged to one-half the power supply voltage (Vcc/2). The inventive technique provides for boosting the selected word line at the beginning of the memory cycle. This technique also overcomes the effects of increased transistor thresholds in certain memory designs employing a back-gate bias voltage. For example, an increase in thresholds due to an increased back-gate bias effect is produced in some DRAMs employing complementary field effect transistor (e.g., CMOS) logic circuitry.

Figure 2:
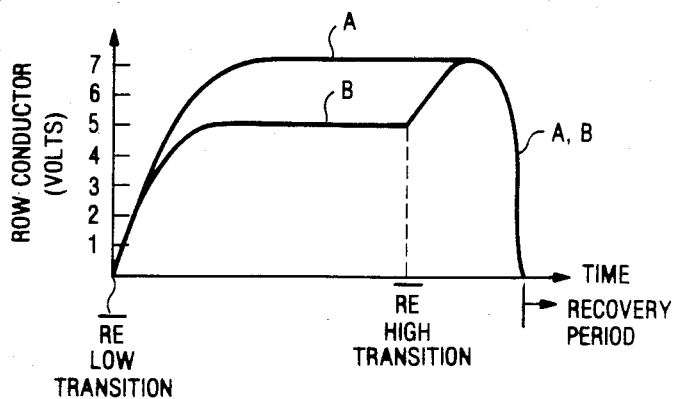
FIG. 2 illustrates typical prior art boost periods during a memory cycle.

Referring again to FIG. 1, the column conductor C1 and its complement, $\overline{C1}$ are precharged during the recovery period of the memory cycle. This period occurs in the latter part of a memory cycle, before a new address is accepted for the following cycle (see FIG. 2). As shown, precharging can conveniently be accomplished by applying a positive boosted voltage to the gates of precharge transistors M13 and M14. The drains of M13 and M14 are connected to a regulated voltage, Vcreg, typically having a value of Vcc/2. In the case of a nominal 5 volt Vcc level, the columns are thus precharged to 2.5 volts in an illustrative case used herein. However, precharging to other levels is possible.

When a given row conductor (e.g., R1) is selected, a high positive voltage level (e.g., 5 volts) is placed on the gates of the n-channel access transistors in that row. If p-channel access transistors are used, a low gate voltage (e.g., 0 volts) is used for access; otherwise, the considerations discussed herein are identical. Note also that p-channel boosting implies an application of a voltage more negative than Vss. In both cases, the boosting provides a voltage magnitude on the row conductor in excess of the voltage supplied to the memory cells from the column conductor connected thereto. In particular, the column conductor voltage used to store a "1" is typically at the Vcc (5 volt) level; the boosted voltage is (in magnitude) then in excess of the power voltage supply.

To ensure adequate margins for satisfactory transfers of a "1" stored in the capacitor (10) to the column conductor, the gate of the access transistor (M11) should be at least a certain voltage more positive than its source, which is connected to the column conductor (C1), as noted above. However, the column precharge operation occurred during the prior cycle. Hence, if the power supply voltage decreases following precharge, the gate voltage present may be insufficient for satisfactory transfer. For example, Vcc=5.5 volts may be present during precharge, in which case the column conductor (C1) is precharged to 2.75 volts. A rapid decrease in the power supply voltage, referred to as "slew" in the art, is a possible occurrence. Then, the gate voltage during the subsequent access operation may be only 4.5 volts, the minimum power supply level typically specified. This means that the access transistor (M11) is forward biased only 4.5−2.75=1.75 volts during the reading of a cell having a "1" stored on the capacitor. Typical access transistors presently have threshold voltages of about 1 to 1.5 volts. Hence, the gate to source voltage, Vgs, may be only slightly in excess of the threshold voltage. The access transistor then only weakly conducts, and inadequate transfer of charge between the column conductor and the storage capacitor may result, causing a data error during the read operation.

Figure 3:
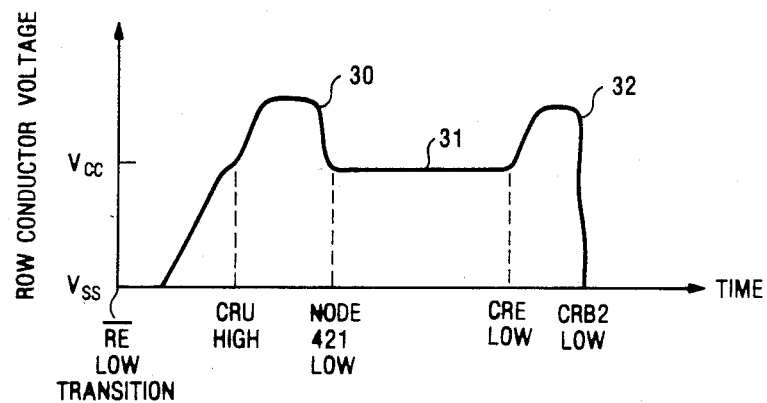
FIG. 3 illustrates boost periods according to the present invention.

The present invention provides increased protection against this problem by boosting the selected row conductor during an initial portion of the access operation. Referring to FIG. 3, this initial boost period (30) is followed by a period (31) when the gate voltage on M11, which is equal to the row conductor voltage, is reduced to the positive power supply voltage, Vcc. Note that unless otherwise specified, the voltages herein are measured with respect to the negative power supply potential, Vss. An optional boost (32) is then provided during the refresh portion of the cycle. This technique then provides increased margins for transferring information into, and out of, the storage capacitor. In addition, it avoids the necessity of providing the boost throughout the memory cycle, which can place excess electrical stress on the access transistor. Also, a continuously boosted word line in the prior art typically was accomplished by initially boosting the word line, and relying on low leakage currents to maintain the boost throughout the memory cycle. As noted above, this is an inherently less reliable operation that boosting when needed, and clamping the row conductor at the power supply level at other times.

Figure 4:
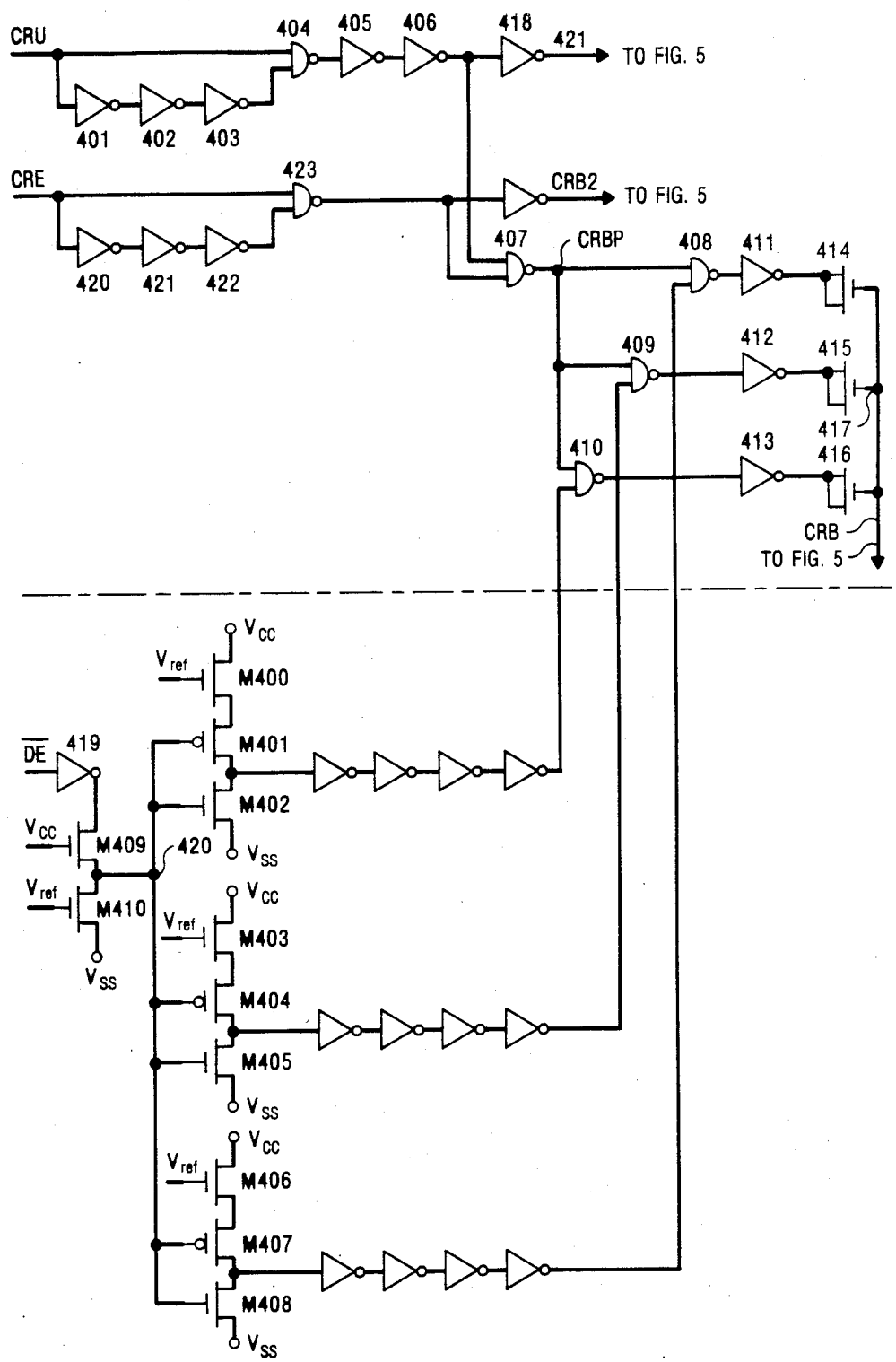
FIGS. 4 and 5 illustrate a circuit suitable for implementing the present invention.

Referring to FIG. 4, a circuit suitable for implementing the present invention is shown. The word line boost of the present invention, also referred to as the "initial boost" herein, is initiated when a signal CRU makes a low to high voltage transition. The CRU signal shown is derived from a "clock row decode" (CRD) signal (FIG. 5) that marks the initiation of a row decode operation. The CRU transition is transformed into a negative pulse having a duration determined by the delay inverter stages 401–403 plus that of NAND gate 404. After inversions through stages 405–407, the signal appears as a positive pulse CRBP, which is supplied to NAND gates 408–410. These gates serve in an optional variable boost control circuit, explained further below. After passing through one or more of gates 408–410, the pulse is then inverted by inverters 411–413, and applied to one or more of boost capacitors 414–416. The opposite plates of these capacitors are connected together at boosted node 417. The degree of the boost depends upon the number of the boost capacitors thus supplied with a positive pulse, as discussed below. The boosted voltage on node 417, signal CRB, then may be routed to the row decoder for application to the selected word line.

Figure 5:
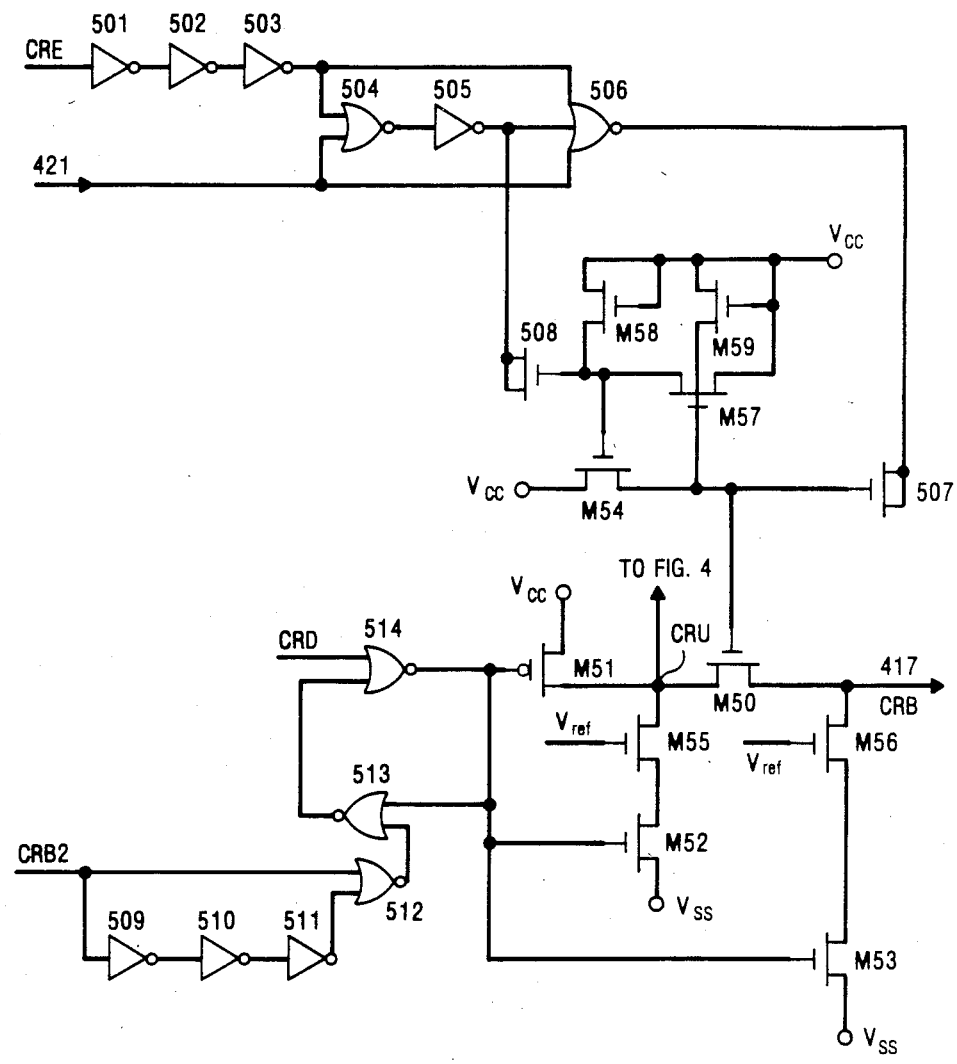

Referring to FIG. 5, a circuit for controlling the discharge of the row conductor from the boosted level is shown. The discharge of boosted node 417 to Vcc is accomplished through transmission gate M50. When the row enable signal $\overline{RE}$ goes low, the clocked row enable signal CRE goes high a fixed time thereafter.

Figure 6:
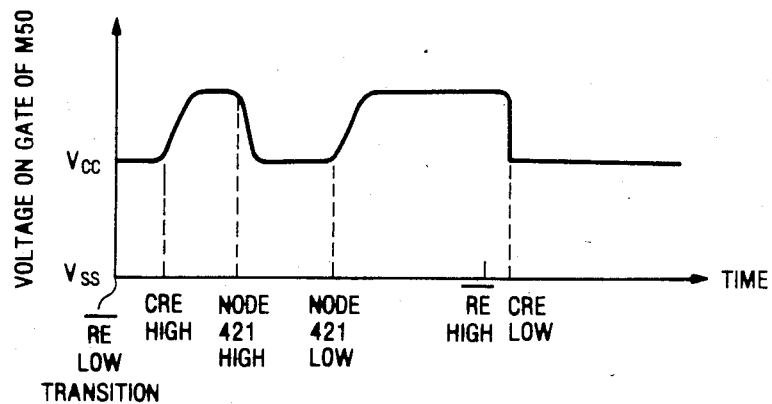
FIG. 6 illustrates the gate voltage on transistor M50.

When CRE goes high, a positive boost voltage is provided through boost capacitor 507 to the gate of M50. This allows M50 to conduct, so that the voltage on node 417 can be controlled by transistors M51 and M52, in addition to M53, as discussed below. The voltage on the gate of M50 is shown in FIG. 6 in approximate relation to the voltage on the row conductor in FIG. 3. The duration of the first boost on M50 is controlled by the voltage on node 421, which in turn is controlled by, and delayed from, the CRU signal (FIG. 4). During this first boost, the voltage on the row conductor (node 417) is initially raised from Vss to Vcc by conduction through M51; see FIG. 3. This conduction results from a high voltage on the CRD input of NOR gate 514, which places a low voltage on the gate of p-channel transistor M51. Prior to that time, CRD was low to ensure completion of the row address decoding before the row line could be activated.

After the row conductor is thus precharged to Vcc, the "initial boost" signal CRU goes high, which causes node 421 to also go high (FIG. 4). The CRU signal causes the initial boost to occur, as explained above. The high level on node 421 causes the voltage on the gate of M50 to return to Vcc. This occurs as follows: a high level on node 421 causes a positive boost voltage to be placed on capacitor 508 by means of gates 504–505.

This boost causes transistor M54 to conduct, which discharges the boosted gate of M50 to Vcc; see FIG. 6. This action prevents M50 from conducting charge away from the boosted row conductor, hence allowing it to remain boosted for the initial boost period. (Note also the inclusion of M57–M59 to precharge the circuits connected thereto to Vcc.)

After a fixed time delay from CRU high, as determined by the propagation delay through inverters 401–403, the CRBP signal goes low, which discharges the row conductor (node 417) to Vcc. Node 421 also goes low, causing gate 506 and capacitor 507 to again boost the gate voltage on M50. This allows M50 to actively clamp the row conductor (node 417) to Vcc through transistor M51, thus terminating the initial boost period; see FIG. 3.

When the $\overline{RE}$ signal supplied to the memory goes high at the end of a cycle, the CRE signal goes low a fixed delay thereafter. This CRE transition initiates the "refresh boost" period, as discussed above for FIGS. 3 and 4. At the end of the refresh boost period, the CRB2 and CRBP signals (FIG. 4) go low. Referring again to FIG. 5, the CRB2 low transition causes a high voltage level to appear at the output of gate 512. This causes gate 513 to change to a low output level, and gate 514 to change to a high output level, since the CRD signal is also low by this time. The high level from gate 514 causes n-channel transistors M52 and M53 to conduct, while turning M51 off. Transistor M53 then discharges the row conductor (node 417) to Vss; see FIG. 3. It remains at this level until the $\overline{RE}$ signal again goes low, initiating a new cycle. Transistor M52 serves to discharge the side of M50 opposite to the row conductor, to ensure full discharge thereof. The transistors M52–M53 are protected against excess voltage by transistors M55–M56, respectively. Note also that after a fixed delay as determined by gates 509–511, the output of gate 512 goes low. This allows the output of gate 513 to respond to the output of gate 514, until the CRD signal again goes high, causing the row conductor to charge to Vcc, as before.

As noted above, the amount that the row voltage is boosted may optionally be varied. Referring to FIG. 4, this may be achieved by switching from 0 to 3 boost capacitors 414–416. This action is under the control of a series of inverter stages (M400–M408) having differing switching thresholds. These stages act as comparators to determine when the positive power supply voltage, Vcc, exceeds predetermined values. The logic control for the boost signal, gates 408–410, then enables the corresponding boost capacitors. If Vcc is above a given level, then no boost capacitors are enabled, and the row conductor is charged only to Vcc during the initial and refresh boost periods.

To implement this function, a voltage divider comprising transistors M409 and M410 provide a reduction in the value of Vcc. The Vcc level is derived from inverter 419 when the $\overline{DE}$ signal is low during the active portion of a memory cycle; the divided voltage at node 420 is typically about 2 volts. This divided voltage still tracks changes in Vcc at the reduced value, and is applied to the gates of the inverter transistors. The difference in transistor gain between the p-channel transistor and the n-channel transistor of a given inverter provides for the variation in switching thresholds. For example, when the width and length values of the channels are such that both transistors have equal gain, the switching threshold is about one-half of the voltage supplied across the pair. This voltage is one threshold voltage drop below Vref, the gate voltage applied to transistors M400, M403, and M406. With Vref=5.5 volts and a threshold of 1.5 volts, this implies that 4 volts appears across each inverter pair. For an illustrative case, the transistor gains are chosen to produce thresholds that enable successive capacitors at 4.7, 5.3, and 6 volt levels of Vcc. This produces a boosted row voltage that is regulated to within 1 volt (e.g., in the range of 6 to 7 volts) when Vcc varies from 4 to 7 volts. Advantages of this technique include improved boost at low Vcc levels, to improve signal transfer to the storage capacitors, while avoiding excessive boost voltages that could damage the access transistors and selected junctions at high Vcc levels.

What is claimed is:

1. An integrated circuit comprising an array of memory cells adapted to operate at a power supply voltage and arranged in rows and columns, with said memory cells comprising an access transistor and an information storage capacitor, wherein a column conductor is connected to a column of said memory cells and a row conductor is connected to the control terminals of the access transistors in a row of said memory cells; and further comprising row selection means for selecting a given row by applying a row voltage to the row conductor thereof, characterized in that said integrated circuit further comprises means for boosting said row voltage in excess of said power supply voltage during an initial period following said selecting a given row, and for thereafter reducing said row voltage to a level equal to said power supply voltage during a subsequent period of the memory cycle prior to the refresh portion of the memory cycle.

2. The integrated circuit of claim 1 further comprising means for again boosting said row voltage during the refresh portion of the memory cycle.

3. The integrated circuit of claim 1 further comprising means for precharging the column conductors of said array to a level approximately one-half of the power supply level.

4. The integrated circuit of claim 1 further comprising complementary field effect transistor logic circuits.

* * * * *